(12) United States Patent
Martin

(10) Patent No.: US 10,038,122 B2
(45) Date of Patent: Jul. 31, 2018

(54) LIGHT EMITTING DIODE DEVICE

(71) Applicant: KONINKLIJKE PHILIPS N.V., Eindhoven (NL)

(72) Inventor: Paul Scott Martin, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 14/901,675

(22) PCT Filed: Jun. 20, 2014

(86) PCT No.: PCT/IB2014/062477
§ 371 (c)(1),
(2) Date: Dec. 28, 2015

(87) PCT Pub. No.: WO2014/207635
PCT Pub. Date: Dec. 31, 2014

(65) Prior Publication Data
US 2017/0040496 A1 Feb. 9, 2017

Related U.S. Application Data

(63) Continuation of application No. PCT/CN2013/000785, filed on Jun. 28, 2013.

(51) Int. Cl.
*H01L 33/00* (2010.01)
*H01L 33/48* (2010.01)
(Continued)

(52) U.S. Cl.
CPC .......... *H01L 33/483* (2013.01); *H01L 25/165* (2013.01); *H01L 25/167* (2013.01); *H01L 33/54* (2013.01); *H01L 33/56* (2013.01); *H01L 33/58* (2013.01); *H01L 33/62* (2013.01); *H01L 33/641* (2013.01); *H01L 33/647* (2013.01);
(Continued)

(58) Field of Classification Search
CPC ....... H01L 33/483; H01L 33/56; H01L 33/58; H01L 33/62; H01L 25/165; H01L 33/641; H01L 33/647; H01L 25/167; H01L 2933/005; H01L 2933/0033
See application file for complete search history.

(56) References Cited

U.S. PATENT DOCUMENTS 4,054,814 A 10/1977 Fegley et al.
6,084,252 A 7/2000 Isokawa et al.
(Continued)

FOREIGN PATENT DOCUMENTS

CN 1502128 A 6/2004
CN 2679856 Y 2/2005
(Continued)

OTHER PUBLICATIONS

EPO as ISA for PCT/IB2014/062477, filed Jun. 20, 2014, "International Search Report and Written Opinion," dated Sep. 9, 2014, 11 pages.
(Continued)

*Primary Examiner* — Vu A Vu

(57) ABSTRACT

A device according to embodiments of the invention includes a light emitting diode (LED) mounted on an electrically conducting substrate. A lens is disposed over the LED. A polymer body is molded over the electrically conducting substrate and in direct contact with the lens.

21 Claims, 2 Drawing Sheets

(51) Int. Cl.
  *H01L 25/16* (2006.01)
  *H01L 33/54* (2010.01)
  *H01L 33/56* (2010.01)
  *H01L 33/58* (2010.01)
  *H01L 33/62* (2010.01)
  *H01L 33/64* (2010.01)

(52) U.S. Cl.
  CPC .......................... *H01L 2924/0002* (2013.01); *H01L 2933/005* (2013.01); *H01L 2933/0033* (2013.01)

(56) References Cited

U.S. PATENT DOCUMENTS

| | | | |
|---|---|---|---|
| 6,518,600 B1 | 2/2003 | Shaddock | |
| 6,828,590 B2 * | 12/2004 | Hsiung | H01L 33/54 |
| | | | 257/100 |
| 6,924,514 B2 * | 8/2005 | Suenaga | H01L 33/486 |
| | | | 257/100 |
| 7,098,485 B2 * | 8/2006 | Isokawa | H01L 33/54 |
| | | | 257/98 |
| 7,131,759 B2 * | 11/2006 | Ishida | F21S 48/1154 |
| | | | 257/E33.072 |
| 7,358,598 B2 * | 4/2008 | Diot | H01L 21/565 |
| | | | 257/666 |
| 7,365,371 B2 * | 4/2008 | Andrews | H01L 33/52 |
| | | | 257/100 |
| 7,391,046 B2 * | 6/2008 | Tsutsumi | C09K 11/02 |
| | | | 257/12 |
| 7,465,069 B2 * | 12/2008 | Li | F21K 9/00 |
| | | | 362/294 |
| 7,517,728 B2 * | 4/2009 | Leung | H01L 33/507 |
| | | | 257/E21.499 |
| 7,972,040 B2 * | 7/2011 | Li | F21K 9/233 |
| | | | 362/237 |
| 8,044,418 B2 * | 10/2011 | Loh | H01L 33/483 |
| | | | 257/666 |
| 8,129,734 B2 * | 3/2012 | Mazzochette | H01L 33/641 |
| | | | 156/512 |
| 8,138,000 B2 * | 3/2012 | Keller | H01L 25/167 |
| | | | 257/95 |
| 8,193,547 B2 * | 6/2012 | Loh | H01L 33/642 |
| | | | 257/100 |
| 8,299,159 B2 * | 10/2012 | Chandrasekhar | H01B 1/22 |
| | | | 524/404 |
| 2001/0026011 A1 | 10/2001 | Roberts et al. | |
| 2005/0072981 A1 | 4/2005 | Suenga | |
| 2006/0045530 A1 * | 3/2006 | Lim | H04B 10/43 |
| | | | 398/135 |
| 2007/0090381 A1 * | 4/2007 | Otsuka | C09K 11/64 |
| | | | 257/98 |
| 2010/0046223 A1 | 2/2010 | Li et al. | |
| 2011/0278623 A1 | 11/2011 | Kobayakawa | |
| 2012/0228649 A1 * | 9/2012 | Kim | H01L 33/486 |
| | | | 257/88 |
| 2013/0034818 A1 * | 2/2013 | Beasley | C07C 209/02 |
| | | | 432/9 |

FOREIGN PATENT DOCUMENTS

| | | | |
|---|---|---|---|
| CN | 101110462 A | 1/2008 | |
| DE | 19833245 A1 | 2/1999 | |
| JP | 03067461 | * 7/1991 | ............ H01L 33/00 |
| JP | 1991067461 U | 7/1991 | |
| JP | 2006156588 A | 6/2006 | |
| JP | 2009104896 A | 5/2009 | |
| WO | 2007139780 A2 | 12/2007 | |

OTHER PUBLICATIONS

First Office Action dated Apr. 12, 2017, China Patent Application No. 201480037033.1, LUM Reference No. 2013P00783WOCN, 19 pages.
Second Office Action dated Dec. 14, 2017, China Patent Application No. 201480037033.1, 18 pgs.
JP Office Action dated Feb. 6, 2018, Japan Patent Application No. 2016-522917, 5 pages.
Third Office Action dated Apr. 18, 2018, China Patent Application No. 201480037033.1, 12 pages.

* cited by examiner

LIGHT EMITTING DIODE DEVICE

CROSS-REFERENCE TO RELATED APPLICATIONS

The present application is a § 371 application of International Application No. PCT/IB2014/062477 filed on Jun. 20, 2014 and titled "Light emitting diode device," which claims the benefit of PCT/CN2013/000785, filed Jun. 28, 2013. Both PCT/IB2014/062477 and PCT/CN2013/000785 are incorporated herein.

FIELD OF THE INVENTION

The present invention relates to a lamp set using solid state light source integrated into a system without separately packaged LEDs.

BACKGROUND

Solid state lighting systems including LEDs generally have one or more LED dice inside an LED package, which is assembled onto a printed circuit board (PCB), sometimes in combination with an electrical driver that can be either co-located or separately connected. The LED-containing PCB is combined with one or more secondary optic(s), placed in a bulb, and assembled into a lamp. The multiple layers of packaging, including for example the LED package, the PCB, the secondary optics, the bulb, and the lamp, increase the size, the cost, and the complexity of manufacturing the lamp. Also, multiple layers of packaging may reduce light extraction from the lamp, as light has to be extracted from each of the layers of packaging, and each layer of packaging generally absorbs some light. These same multiple layers of packaging may also reduce the efficiency of heat extraction from the LEDs thus further reducing their optical efficiency.

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen and/or phosphorus. Typically, III-V light emitting devices are fabricated by epitaxially growing a stack of semiconductor layers of different compositions and dopant concentrations on a sapphire, silicon carbide, silicon, III-nitride, GaAs or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

SUMMARY

It is an object of the invention to provide one or more LED(s) attached to a conductive substrate and disposed in a molded body which form a complete lighting unit that may be used for example as a bulb or a full lamp set.

A device according to embodiments of the invention includes an LED mounted on an electrically conducting substrate. A lens is disposed over the LED. A polymer body is molded over the electrically conducting substrate and in direct contact with the lens.

A method according to embodiments of the invention includes attaching an LED to an electrically conducting substrate and molding a body over the LED and the electrically conducting substrate. The body is thermally conductive and electrically insulating. A lens disposed over the LED and a portion of the electrically conducting substrate protrude from the body.

DETAILED DESCRIPTION

Though in the examples below the semiconductor light emitting devices are III-nitride LEDs that emit blue or UV light, semiconductor light emitting devices besides LEDs such as laser diodes, semiconductor light emitting devices made from other materials systems such as other III-V materials, III-phosphide, III-arsenide, II-VI materials, ZnO, or Si-based materials, or non-semiconductor light emitting devices may be used.

Figure 1:
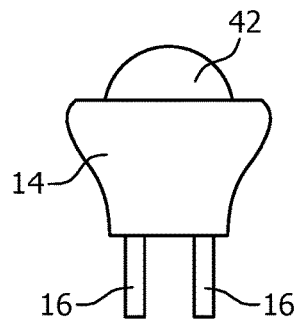
FIG. 1 illustrates a structure including an LED disposed in a molded body. A lens over the LED and leads from a conductive substrate to which the LED is attached protrude from the molded body.

In embodiments of the invention, a lens is formed over an LED. The LED is mounted on a conductive frame or substrate, then a body is molded around the LED, the lens, and the conductive substrate. FIG. 1 illustrates an embodiment of the invention. The molded body 14 is illustrated at the center of FIG. 1. Molded body 14 may be, for example, polymer. In some embodiments, molded body 14 is thermally conductive plastic, which may conduct heat away from the LED and into the air or the conductive substrate, where it can be removed from the device. A portion of a lens 42 formed over the LED protrudes from the top of molded body 14. Two leads 16, which are electrically connected to or part of the conductive substrate on which the LED is mounted, protrude from the bottom of molded body 14.

Though the structure of FIG. 1 includes only one LED disposed in a molded body, in other embodiments, multiple LEDs may be disposed in the molded body. Also, though the structure of FIG. 1 illustrates the lens 42 protruding from the top of the molded body and the leads 16 protruding from the bottom of the molded body, embodiments of the invention are not limited to this arrangement. For example, instead of or in addition to the lens 42 protruding from the top of the molded body, one or more lenses may protrude from the sides or bottom of the molded body. The molded body is not limited to the shape illustrated.

Figure 2:
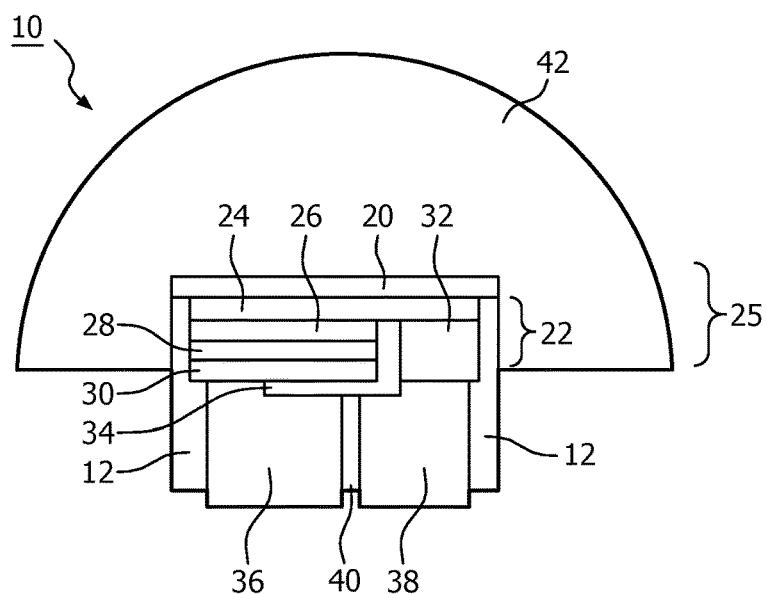
FIG. 2 illustrates an example of an LED.

FIG. 2 illustrates one example of a suitable LED. Any suitable LED or other light emitting device may be used and the invention is not limited to the LED illustrated in FIG. 2. The device illustrated in FIG. 2 is a flip chip, meaning that one or more reflective contacts on the bottom of the LED body 25 direct light out the top of the LED into lens 42. Other device geometries may be used; the invention is not limited to flip chip LEDs.

The LED illustrated in FIG. 2 may be formed as follows. A semiconductor structure 22 is grown on a growth substrate (not shown in FIG. 2) as is known in the art. The growth substrate is often sapphire but may be any suitable substrate such as, for example, SiC, Si, GaN, or a composite substrate. The semiconductor structure 22 includes a light emitting or active region sandwiched between n- and p-type regions. An n-type region 24 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 26 is grown over the n-type region. Examples of suitable light emitting regions include a single thick or thin light emitting layer, or a multiple quantum well light emitting region including multiple thin or thick light emitting layers separated by barrier layers. A p-type region 28 may then be grown over the light emitting region. Like the n-type region, the p-type region may include multiple layers of different composition, thickness, and dopant concentration, including layers that are not intentionally doped, or n-type layers.

After growth of the semiconductor structure, a p-contact is formed on the surface of the p-type region. The p-contact 30 often includes multiple conductive layers such as a reflective metal and a guard metal which may prevent or reduce electromigration of the reflective metal. The reflective metal is often silver but any suitable material or materials may be used. After forming the p-contact 30, a portion of the p-contact 30, the p-type region 28, and the active region 26 is removed to expose a portion of the n-type region 24 on which an n-contact 32 is formed. The n- and p-contacts 32 and 30 are electrically isolated from each other by a gap which may be filled with a dielectric 34 such as an oxide of silicon or any other suitable material. Multiple n-contact vias may be formed; the n- and p-contacts 32 and 30 are not limited to the arrangement illustrated in FIG. 2. The n- and p-contacts may be redistributed to form bond pads with a dielectric/metal stack, as is known in the art.

Thick metal pads 36 and 38 are formed on and electrically connected to the n- and p-contacts. Pad 38 is electrically connected to n-contact 32. Pad 36 is electrically connected to p-contact 30. Pads 36 and 38 are electrically isolated from each other by a gap 40, which may be filled with a dielectric material. Gap 40 may be filled with the same material 12 that separates neighboring LEDs 10 in some embodiments, a different solid material in some embodiments, or air in some embodiments. Pad 38 is electrically isolated from the p-contact 30 by dielectric 34, which may extend over a portion of the p-contact 30. Pads 36 and 38 may be, for example, gold, copper, alloys, or any other suitable material formed by plating or any other suitable technique. Pads 36 and 38 in some embodiments are sufficiently thick to support the semiconductor structure 22 such that the growth substrate can be removed.

In some embodiments, instead of thick metal pads 36 and 38, the semiconductor structure is attached to a host substrate, which may be, for example, silicon, ceramic, metal, or any other suitable material. In some embodiments, the growth substrate remains attached to the semiconductor structure. The growth substrate may be thinned and/or textured, roughened, or patterned.

Many individual LEDs 10 are formed on a single wafer. In the regions between neighboring LEDs 10, the semiconductor structure is entirely removed by etching down to the substrate, or the semiconductor structure is etched down to an electrically insulating layer. A dielectric material 12 is disposed in the areas between LEDs 10. Material 12 may mechanically support and/or protect the sides of LEDs 10 during later processing, such as dicing. Material 12 may also be formed to prevent or reduce the amount of light from escaping from the sides of LEDs 10.

The growth substrate is then removed from a wafer of LEDs. The growth substrate may be removed by, for example, laser melting, etching, mechanical techniques such as grinding, or any other suitable technique. The semiconductor structure 22 of LEDs 10 may be thinned after removing the growth substrate, and/or the exposed top surface may be roughened, textured, or patterned, for example to improve light extraction from the LEDs 10.

In some embodiments, a wavelength converting layer 20 is connected to the surface of LEDs 10 exposed by removing the growth substrate, or to the growth substrate in devices where the growth substrate remains attached to the semiconductor structure. Wavelength converting layer 20 may be any suitable material formed by any suitable technique. Multiple wavelength converting layers may be used. The wavelength converting material may be conventional phosphors, organic phosphors, quantum dots, organic semiconductors, II-VI or III-V semiconductors, II-VI or III-V semiconductor quantum dots or nanocrystals, dyes, polymers, or other materials that luminesce. In various embodiments, wavelength converting layer 20 may be, for example, one or more powder phosphors mixed with transparent material such as silicone that is dispensed, screen printed, stenciled, or pre-formed then laminated over LED 10, or a pre-formed luminescent ceramic or phosphor dispersed in glass or other transparent material that is glued or bonded to LED 10.

The wavelength converting layer 20 absorbs light emitted by the LEDs and emits light of one or more different wavelengths. Unconverted light emitted by the LEDs is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light emitted from the structure.

Non-wavelength-converting materials, for example to cause scattering or to alter the index of refraction of the layer, may be added to the wavelength converting layer 20. Examples of suitable materials include silica and $TiO_2$. In some embodiments, no wavelength converting material is used in the device.

Before or after forming the wavelength converting layer 20 or attaching a pre-formed wavelength converting layer 20 to the LED, a wafer of LEDs may be diced into individual LEDs or groups of LEDs. The LED illustrated in FIG. 2 is separated from a wafer by cutting the dielectric 12 surrounding the LED body 25.

An optical element 42 is disposed over the LED. Optical element 42 is a structure that may alter the pattern of light emitted by the LED. Examples of suitable optical elements include lenses such as dome lenses and Fresnel lenses, and other structures such as optical concentrators. For economy of language, optical element 42 is referred to herein as a lens. Lens 42 may be a pre-formed lens that is glued or otherwise attached to LED body 25, or a lens that is formed over LED body 25, for example by molding. Lens 42 often extends over the sides of LED body 25 as illustrated in FIG. 2. In some cases one physical lens may cover more than one LED. The use of one lens over multiple LEDs may have advantages in optical performance of the system, since by placing multiple LEDs on the conducting substrate, LEDs of different color, different shape, and/or different electrical performance can be placed in proximity to each other and with specific optical coupling into a suitable, single physical lens.

A molded lens 42 may be formed as follows. A mold with an interior shaped as lens 42 is lowered over the LED body 25. The mold may optionally be lined with a non-stick film that prevents the sticking of molding material to the mold. In some embodiments, plasma such as $O_2$ plasma is applied to the top surface of the LED body 25, to improve the adhesion of the molding material to the LED body. The region between the mold and the LED body 25 is filled with a heat-curable liquid molding material. The molding material may be any suitable optically transparent material such as silicone, an epoxy, or a hybrid silicone/epoxy. A hybrid may be used to more closely match the coefficient of thermal expansion (CTE) of the molding material to that of the LED body 25. Silicone and epoxy have a sufficiently high index of refraction (greater than 1.4) to facilitate light extraction from the LED as well as act as a lens. One type of silicone has an index of refraction of 1.76. In some embodiments, a wavelength converting material such as phosphor is dispersed in the molding material. An optical element with dispersed wavelength converting material may be used instead of or in addition to wavelength converting layer 20. A vacuum seal may be created between the LED body 25 and the mold, and the two pieces may be pressed against each other so that the LED is inserted into the liquid molding material and the molding material is under compression. The mold may then be heated, for example to about 150° C. or other suitable temperature for a suitable time to harden the molding material into lens 42. The finished device, as illustrated in FIG. 2, is then released from the mold.

Lens 42 may be formed over the LED body 25 before or after attaching the LED to a conductive substrate, as described below.

Figure 3:
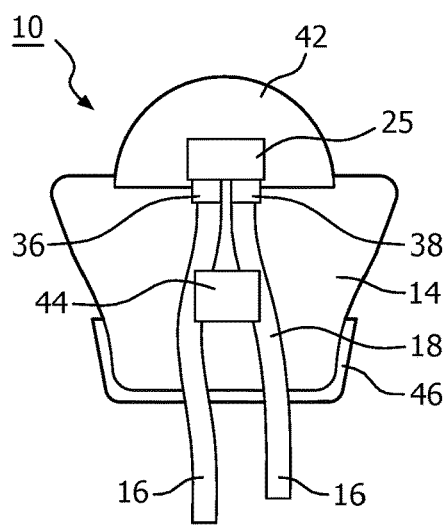
FIG. 3 is a cross sectional view of the structure illustrated in FIG. 1.

FIG. 3 is a cross section of the structure illustrated in FIG. 1.

As illustrated in FIG. 3, the pads 36 and 38 are electrically and physically attached to an electrically conducting substrate 18. Conductive substrate 18 may be metal, flexible polymer such as polyimide, or any other suitable material that can sustain exposure to temperatures required for polymer molding (e.g. temperatures in excess of 260° C. for more than 10 seconds). In some embodiments, conductive substrate 18 is a material with thermal conductivity of at least 100 W/mK such as, for example, C194 copper. Conductive substrate 18 includes electrically isolated members that electrically connect to the anode and cathode connections on the LED (pads 36 and 38 in the device illustrated in FIG. 2) and any other circuit elements. The conductive substrate 18 includes an external portion that protrudes from the molded body. The external portion is used to electrically connect the conductive substrate to a power source which may supply current to the conductive substrate to forward bias the LED, such that the LED emits light. In the structure illustrated in FIGS. 1 and 3, the external portion of the conductive substrate is two leads 16 that may be plugged into an appropriate socket. Any suitable structure, such as, for example, a screw-in cap end of a light bulb, a structure suitable for use in a PAR16 socket, a P21 socket, or any other suitable standard socket, may be substituted for the leads 16 illustrated in FIGS. 1 and 3.

One or more optional additional circuit elements 44 may be attached to conductive substrate 18 within or outside of molded body 14. Additional circuit element 44 may be a non-light-emitting circuit element. Additional circuit element 44 may be, for example, an electrostatic discharge protection circuit, power conditioning circuitry, driver circuitry, control circuitry, a leaded resistor, a leaded diode, or any other suitable circuit element. Leaded resistors and diodes are standard discrete circuit elements with leads (long wires) on both ends. These devices can be conveniently connected to the conducting substrate with techniques such as soldering, laser welding and resistance welding. Leaded components are used when removing the heat source, for example the resistor body, from the temperature sensitive circuit elements, for example the LEDs, is desired. The additional circuit element 44 may be totally encased within the molded body 14, as illustrated in FIGS. 1 and 3, or all or a portion of additional circuit element 44 may protrude from the molded body 14.

Molded body 14 may be any suitable material including, for example, plastic, polycarbonate, polyolefin, PPA, PPS, or polymer such as silicone rubber. In some embodiments, molded body 14 is a thermally conductive plastic with a thermal conductivity of at least 1 W/m-K. In some embodiments, the use of a thermally conducting plastic removes the need for an additional heat-sink. In some embodiments, molded body 14 is a material such as a plastic with an electrical resistivity of at least 10,000 Ω-m, in order to electrically isolate parts disposed within the molded body 14 such as leads 16.

In some embodiments, a portion of molded body 14 is painted or coated with an electrically insulating paint 46. For example, as illustrated in FIG. 3, a portion of the molded body where leads 16 protrude may be painted with electrically insulating paint, such that the thermally conducting plastic of molded body 14 is not in direct contact with the portion of the conductive substrate 18 that protrudes from the molded body 14. The electrically insulating paint allows electrically conductive plastics or polymers to be used as molded body 14. In some embodiments, an electrically conducting molded body 14 may be used to provide an electrical shield to protect the circuit elements from electromagnetic interference (EMI), and/or to reduce or eliminate electrical noise when the circuit is driven with or internally generates a non-DC electrical waveform.

In some embodiments, the body 14 is molded from an electrically conducting polymer such as graphite loaded Polycarbonate. The electrically conducting molded body 14 can itself form part of the electrical circuit for the device, thereby removing a requirement for additional separate components and potentially distributing heat into the molded body 14 or removing heat from the molded body 14.

In some embodiments, the molded body 14 includes fins on the exterior surface which provide direct thermal coupling to the ambient air. These fins may be designed using procedures well known in the art to create efficient heat dissipation structures.

As illustrated in FIG. 3, in some embodiments, molded body 14 covers at least a portion of lens 42. Molded body 14 is in direct contact with a portion of lens 42. Molded body 14 is typically opaque, though it may be transparent or translucent in some embodiments.

Figures 4, 5:
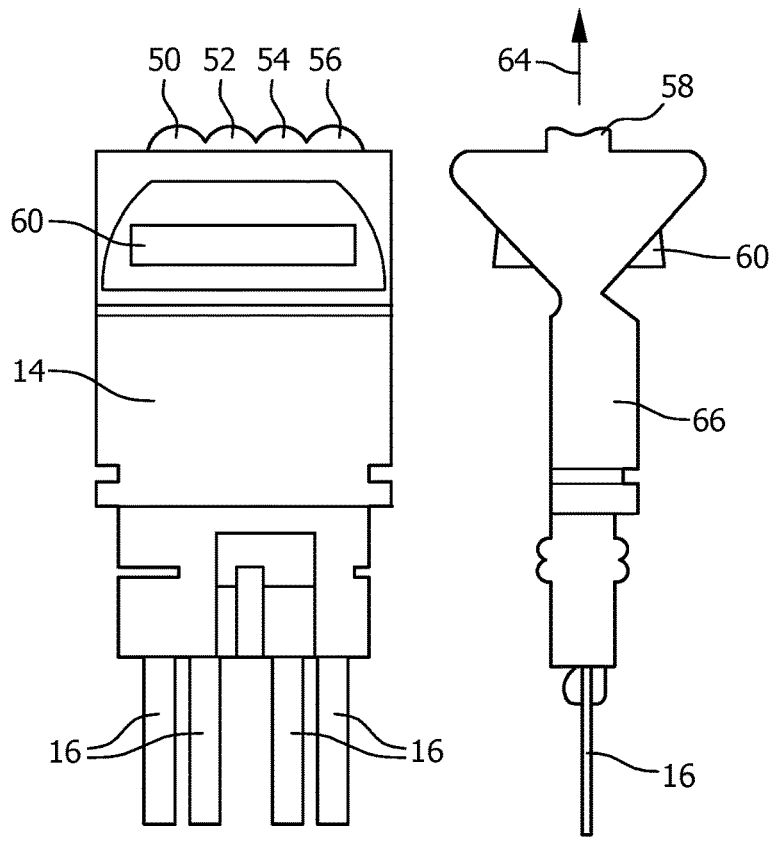
FIGS. 4 and 5 are side views of an embodiment of the invention.

FIGS. 4 and 5 are side views of an embodiment of the present invention. FIG. 4 is rotated 90° from the view shown in FIG. 5. Like the structure illustrated in FIGS. 1 and 3, in the structure illustrated in FIGS. 4 and 5, leads 16, which are part of or attached to the conductive substrate to which the LEDs are attached, protrude from the bottom of the molded body 14.

Lenses corresponding to three groups of LEDs protrude from molded body 14. Lens 58 protrudes from the top of molded body 14 along an axis 64. Lens 60 protrudes from the molded body along an axis 66, 120° from axis 64. Lens 62 protrudes from the molded body along an axis 68, 240° from axis 64. Accordingly, the structure illustrated in FIGS. 4 and 5 can direct light in three different directions.

Each of lenses 58, 60, and 62 may be disposed over a single LED or multiple LEDs arranged in a line or any other suitable arrangement. In embodiments where lenses 58, 60, and 62 are disposed over multiple LEDs, the lens may be a single piece, or individual lenses disposed over each LED. For example, as illustrated in FIG. 4, lens 58 may include lenses 50, 52, 54, and 56, which are aligned over four LEDs. Lenses 50, 52, 54, and 56 may be separate lenses that are separately disposed over the individual LEDs, or a single, integrated piece that includes the four domes illustrated.

As illustrated in FIG. 5, lenses 58, 60, and 62 need not be the same shape. The shape of the lens controls the appearance of light emitted from the structure and depends on the application.

Control circuitry to individually address the multiple LEDs in the structure illustrated in FIGS. 4 and 5 may be disposed within molded body 14, or may be separate from the illustrated structure.

Figure 6:
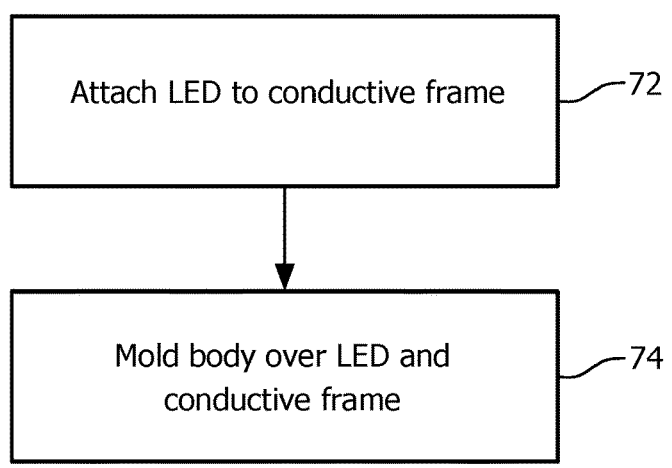
FIG. 6 illustrates a method of making the structures illustrated in FIGS. 1, 3, 4, and 5.

FIG. 6 illustrates a method of forming the devices illustrated in FIGS. 1, 3, 4, and 5. In process 72, an LED is attached to a conductive substrate. In some embodiments, the LED chip is mounted onto a conducting substrate using die attach techniques which do not fail under exposure to typical plastic molding temperatures, which may be, for example, in the range of 280-350° C. Any suitable material may be used to attach the LED to the conductive substrate such as, for example, silver die attach epoxy or eutectic AuSn solder. In addition to the LED chip, other structures which make up the electrical circuit can also be attached to the substrate in some embodiments. In some embodiments, after die attach, one or more wires are bonded to the LED and/or other circuit elements to complete electrical connection to the LED and/or other circuit elements.

In some embodiments, after process 72 the lens is molded over the LED. In some embodiments, lens material is used that maintains at least some of its mechanical strength when subjected to plastic injection molding. Additional components such as leaded resistors or electrical wires or packaged semiconductor devices may be attached to the conducting substrate before or after the lens is formed.

After forming the lens and attaching any non-LED electrical components, the entire assembly is placed in a plastic molding machine such as a traditional injection molding machine. Polymer is molded over the conductive substrate, optional non-LED components, and a portion of the lens in some embodiments, in process 74. In some embodiments, the polymer body forms both the mechanical body of the bulb or lamp and also the heat-sink for carrying heat from the LEDs and other electrical components to the ambient air or to leads 16.

There are many suitable applications for the embodiments described herein. Some embodiments may be used as a replaceable bulb that can be inserted into a socket. The bulb may be replaced if the bulb fails, or to change the character of light emitted from the socket. Some embodiments may be used for automotive lighting. For example, the embodiment illustrated in FIGS. 4 and 5 can be used as a complete lamp that is wired to a vehicle or as a sub-component of a vehicle lamp that can be further integrated into a lamp in a non-replaceable way. Examples of suitable vehicle applications include turn indicators, day time running lamps, headlamps, or tail lamps. In particular, the embodiment illustrated in FIGS. 4 and 5 can be used as part of a tail lamp in a vehicle. One or more of lenses 58, 60, and 62 may be activated as a tail light, one or more of lenses 58, 60, and 62 may be activated as a brake light, and one or more of lenses 58, 60, and 62 may be activated as a reverse light.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A device comprising:
    a light emitting diode (LED) mounted on an electrically conducting substrate;
    a plurality of metal pins electrically connected to the electrically conducting substrate;
    a lens disposed over said LED; and
    a polymer body molded over the electrically conducting substrate and encapsulating the LED and the electrically conducting substrate;
    wherein the lens and the plurality of metal pins protrude from the polymer body and wherein the electrically conducting substrate is at least partially coated with an electrically insulating coating such that the polymer body is not in direct contact with the plurality of metal pins.

2. The device of claim 1 wherein the substrate is a metal frame.

3. The device of claim 1 wherein the polymer body is a thermal plastic selected from the group polycarbonate, polyolefin, PPA, and PPS.

4. The device of claim 1 further comprising a non-light-emitting electronic component attached to the electrically conducting substrate within the polymer body.

5. The device of claim 4 wherein the non-light-emitting electronic component is one of an electrostatic discharge protection circuit, a power conditioning circuit, a driver circuit, a control circuit, a leaded resistor, and a leaded diode.

6. The device of claim 1 wherein the lens comprises one of silicone and epoxy.

7. A system comprising the device of claim 1, the system being used in one or more of the following applications:
    a lamp which is wired to a vehicle and functions in a vehicle circuit as a finished lamp set;
    a sub-component of a vehicle lamp which is further integrated into a lamp in a non-replaceable way;
    a lamp used as vehicle lighting such as a turn indicator, a day time running lamp, a headlamp, or a tail lamp.

8. The device of claim 1 wherein the polymer body is in direct contact with and covers a portion of the electrically conducting substrate disposed beneath the LED.

9. The device of claim 1 wherein the electrically conducting substrate comprises a top surface on which the LED is mounted and a vertical sidewall extending downward from the top surface, wherein the polymer body is in direct contact with and covers a portion of the vertical sidewall.

10. The device of claim 1 wherein the polymer body is in direct contact with and wider than the electrically conducting substrate.

11. The device of claim 1 wherein the body comprises graphite loaded polycarbonate.

12. The device of claim 4 wherein the body is configured to provide an electrical shield to protect the non-light-emitting electronic component from electromagnetic interference.

13. The device of claim 4 wherein the body is configured to reduce or eliminate electrical noise when a circuit comprising the LED and the non-light-emitting electronic component is driven with or internally generates a non-DC electrical waveform.

14. A method comprising:
    attaching a light emitting diode (LED) to an electrically conducting substrate; and
    encapsulating the LED and the electrically conducting substrate by molding a thermally conductive, opaque, and electrically insulating body over the LED and the electrically conducting substrate such that a lens disposed over the LED and a plurality of pins electrically connected to the electrically conducting substrate protrude from the body.

15. The method of claim 14 wherein:
    the lens is in direct contact with the body; and
    the body is opaque plastic.

16. The method of claim 14 further comprising attaching a non-light-emitting electronic component to the electrically conducting substrate, wherein molding comprises encapsulating the non-light-emitting electronic component within the body.

17. The method of claim 14 further comprising gluing the lens to the LED.

18. The method of claim 14 further comprising molding the lens over the LED.

19. The method of claim 14 further comprising forming fins on the exterior surface of the body.

20. The method of claim 14 wherein the LED is a first LED and the lens is a first lens, the method further comprising attaching a second LED to the electrically conducting substrate such that a second lens disposed over the second LED is oriented in a different direction from the first lens, wherein molding the thermally conductive, opaque, and electrically insulating body comprises molding the body such that the second LED is encapsulated and the second lens protrudes from the body.

21. The method of claim 14 wherein attaching the LED to the electrically conducting substrate comprises attaching with one of silver die attach epoxy and eutectic AuSn solder.

* * * * *